US008158254B2

(12) United States Patent
Wang et al.

(10) Patent No.: US 8,158,254 B2
(45) Date of Patent: Apr. 17, 2012

(54) METHODS OF FABRICATING COMPLEX TWO-DIMENSIONAL CONDUCTIVE SILICIDES

(75) Inventors: Dunwei Wang, Newton Highlands, MA (US); Sa Zhou, Chestnut Hill, MA (US)

(73) Assignee: The Trustees of Boston College, Chestnut Hill, MA (US)

( * ) Notice: Subject to any disclaimer, the term of this patent is extended or adjusted under 35 U.S.C. 154(b) by 494 days.

(21) Appl. No.: 12/546,804

(22) Filed: Aug. 25, 2009

(65) Prior Publication Data
US 2010/0044072 A1 Feb. 25, 2010

Related U.S. Application Data

(60) Provisional application No. 61/091,570, filed on Aug. 25, 2008.

(51) Int. Cl.
H01B 5/00 (2006.01)
H05K 3/00 (2006.01)
B05D 5/12 (2006.01)
(52) U.S. Cl. ............... 428/364; 428/446; 427/248.1; 427/96.1; 174/126.1
(58) Field of Classification Search ............... None
See application file for complete search history.

(56) References Cited

U.S. PATENT DOCUMENTS

| 4,957,777 | A | * | 9/1990 | Ilderem et al. ............ 438/677 |
| 6,113,983 | A | | 9/2000 | Zachariah et al. .......... 427/253 |
| 6,361,660 | B1 | | 3/2002 | Goldstein ............. 204/157.15 |
| 6,482,476 | B1 | | 11/2002 | Liu ....................... 427/535 |
| 6,518,156 | B1 | | 2/2003 | Chen et al. .............. 438/597 |
| 6,592,842 | B2 | * | 7/2003 | Elder et al. ............. 423/610 |
| 6,656,573 | B2 | | 12/2003 | Chen et al. .............. 428/195 |
| 6,770,337 | B2 | | 8/2004 | Debe et al. ............. 428/32.6 |
| 6,855,025 | B2 | | 2/2005 | Iwasaki et al. ........... 445/24 |
| 7,235,471 | B2 | | 6/2007 | Jawarani et al. .......... 438/581 |
| 7,485,799 | B2 | | 2/2009 | Guerra ................ 136/245 |
| 2002/0167256 | A1 | * | 11/2002 | Iwasaki et al. ............ 313/309 |

(Continued)

FOREIGN PATENT DOCUMENTS
CN 1822331 A 8/2006
(Continued)

OTHER PUBLICATIONS

Roy et al, In situ xray diffraction analysis of the C49-C54 titanium silicide phase transformation in narrow lines, Applied Physics Letters, vol. 66, No. 14, pp. 1732-1734, 1995.*

(Continued)

Primary Examiner — Harry D Wilkins, III
(74) Attorney, Agent, or Firm — Greenberg Trauig, LLP; David J. Dykeman; Danielle T. Abramson

(57) ABSTRACT

The embodiments disclosed herein relate to the fabrication of complex two-dimensional conductive silicide nanostructures, and methods of fabricating the nanostructures. In an embodiment, a conductive silicide includes a plurality of connected and spaced-apart nanobeams linked together at an about 90-degree angle, the plurality of nanobeams forming a two-dimensional nanostructure having a mesh-like appearance. In an embodiment, a method of fabricating a two-dimensional conductive silicide includes performing chemical vapor deposition, wherein one or more gas or liquid precursor materials carried by a carrier gas stream react to form a nanostructure having a mesh-like appearance and including a plurality of connected and spaced-apart nanobeams linked together at an about 90-degree angle.

23 Claims, 7 Drawing Sheets

U.S. PATENT DOCUMENTS

| | | | |
|---|---|---|---|
| 2003/0138555 A1 | 7/2003 | Debe et al. | 427/152 |
| 2003/0228727 A1 | 12/2003 | Guerra | 438/200 |
| 2005/0051439 A1 | 3/2005 | Jang | 205/639 |
| 2005/0277275 A1* | 12/2005 | Jawarani et al. | 438/581 |
| 2006/0046480 A1* | 3/2006 | Guo | 438/685 |
| 2007/0222013 A1 | 9/2007 | Lincoln et al. | 257/431 |
| 2007/0275160 A1 | 11/2007 | Maldonado et al. | 427/122 |
| 2008/0087998 A1 | 4/2008 | Kamins et al. | 257/686 |
| 2008/0223713 A1 | 9/2008 | Xu et al. | 204/157.15 |
| 2009/0117741 A1* | 5/2009 | Heath et al. | 438/694 |
| 2009/0183994 A1* | 7/2009 | Misra et al. | 205/340 |
| 2010/0043877 A1 | 2/2010 | Wang et al. | 136/256 |

FOREIGN PATENT DOCUMENTS

| | | |
|---|---|---|
| CN | 1843998 A | 10/2006 |
| CN | 1872662 A | 12/2006 |
| JP | 07254574 A | 10/1995 |
| WO | WO 2005/113859 A2 | 12/2005 |
| WO | WO 2006/010926 A1 | 2/2006 |
| WO | WO 2007/120466 A2 | 10/2007 |
| WO | WO 2007/143017 | 12/2007 |
| WO | WO 2008/028522 A1 | 3/2008 |
| WO | WO 2008/060293 | 5/2008 |

OTHER PUBLICATIONS

Goldfarb et al, Scanning tunneling microscopy of titanium silicide nanoislands, Applied Surface Science, No. 238, pp. 29-35, Jul. 2004.*

Alexander, B.D., et al., Metal Oxide Photoanodes for Solar Hydrogen Production, *J. Mater. Chem.*, vol. 18, Issue 20, pp. 2298-2303 (May 28, 2008).

Arico, S., et al., Nanostructured Materials for Advanced Energy Conversion and Storage Devices, *Nature Materials*, vol. 4 (May 2005).

Bak, T., et al., Photo-electrochemical Properties of the TiO2-Pt System in Aqueous Solutions, *International Journal of Hydrogen Energy*, vol. 27, Iss. 1 (Nov. 15, 2001).

Becker, J.S., et al., Highly Conformal Thin Films of Tungsten Nitride Prepared by Atomic Layer Deposition from a Novel Precursor, *Chem. Mater.*, vol. 15, pp. 2969-2976 (Jun. 20, 2003).

Beyers, R., et al., Metastable Phase Formation in Titanium-Silicon Thin Films. *J. Appl. Phys.*, 57, p. 5240 (Jun. 15, 1985).

Bierman, M.J., et al., Dislocation-Driven Nanowire Growth and Eshelby Twist, *Science*, 10.1126/science 1157131 (May 23, 2008).

Bierman, M.J., et al., Hyperbranched PbS and PbSe Nanowires and the Effect of Hydrogen Gas on Their Synthesis, *Nano Lett.*, vol. 7, No. 9 p. 2907-2912 (Aug. 2, 2007).

Bolton, J., Solar Photoproduction of Hydrogen: A review, *Solar Energy*, vol. 57, Iss. 1, pp. 37-50 (Jul. 1, 1996).

Boukai, A. I., et al., Silicon Nanowires as Efficient Thermoelectric Materials, *Nature*, vol. 451, Iss. 7175, pp. 168-171 (Jan. 10, 2008).

Bragagnolo, Julio, et al., The Design and Fabrication of Thin-Film CdS/Cu2S Cells of 9.15-Percent Conversion Efficiency, IEEE Transactions on Electron Devices, vol. Ed 27, No. 4, pp. 645-651 (Apr. 1980).

Burgelman, M., et al., Theoretical Advantages of $pn^+$-Type $Cu_2S$-ZnO Solar Cell, *Electronics Letters*, vol. 17, No. 6 (Mar. 19, 1981).

Cao, Yang, et al., A Technique for Controlling the Alignment of Silver Nanowires with an Electric Field, *Nanotechnology*, vol. 17, pp. 2378-2380 (Apr. 11, 2006).

Chan, Candace K., et al., High-Performance Lithium Battery Anodes Using Silicon Nanowires, *Nature Nanotechnology*, vol. 3, pp. 31-35 (Dec. 16, 2007).

Chen, J., et al., Comparison of $TiSi_2$, $CoSi_2$, and NiSi for Thin-Film Silicon-on-Insulator Applications. *J. Electrochem. Soc*, 144, 2437 (Jul. 1997).

Chen, X. B., et al., Synthesis of Titanium Dioxide ($TiO_2$) Nanomaterials, *J. Nanosci. Nanotechnol.*, vol. 6, No. 4, pp. 906-925 (Apr. 2006).

Chueh, Yu-Lun, et al., $TaSi_2$ Nanowires: A Potential Field Emitter and Interconnect, *Nano Lett*, vol. 6, No. 8, 1637-1644 (Jul. 12, 2006).

Cui, Li-Feng, et al., Carbon-Silicon Core-Shell Nanowires as High Capacity Electrode for Lithium Ion Batteries, *Nano Lett.*, 9 (9), pp. 3370-3374 (Aug. 5, 2009).

Decker, C.A., et al., Directed Growth of Nickel Silicide Nanowires, *Appl. Phys. Lett.*, vol. 84, pp. 1389-1391 (Feb. 23, 2004).

Du, J., et al., Growth Mechanism of TiSi Nanopins on $Ti_5Si_3$ by Atmospheric Pressure Chemical Vapor Deposition. *Journal of Physical Chemistry C*, vol. 111, pp. 10814-10817 (Jul. 4, 2007).

Ekman, M., et al., Electronic Structure and Bonding Properties of Titanium Silicides. *Phys. Rev. B: Condens. Matter*, vol. 57, p. 4419 (Feb. 15, 1998).

Fan, Zhiyong, et al., Three-Dimensional Nanopillar-Array Photovoltaic on Low-Cost and Flexible Substrates, *Nature Materials*, vol. 8, pp. 648-653 (Aug. 2009).

Gao, P., et al., Self-Assembled Nanowire-Nanoribbon Junction Arrays of ZnO. *J. Phys. Chem. B*, vol. 106, pp. 12653-12658 (Nov. 12, 2002).

Garnett, E.C., Silicon Nanowire Radial p-n Junction Solar Cells, *J. Am. Chem. Soc.*, vol. 130 (29), pp. 9224-9225 (Jun. 25, 2008).

Ghicov, A., et al., Lattice Widening in Niobium-Doped $TiO_2$ Nanotubes: Efficient Ion Intercalation and Swift, *Angew. Chem. Int. Ed.*, vol. 47, Iss. 41, pp. 7934-7937 (Sep. 9, 2008).

Givargizov, E.I., Fundamental Aspects of VLS Growth, *J. Cryst. Growth* vol. 31, pp. 20-30 (Dec. 1975).

Goodey, A.P., et al., Silicon Nanowire Array Photoelectrochemical Cells, *J. Am. Chem. Soc.*, vol. 129, pp. 12344-12345 (Sep. 25, 2007).

Graetz, J., et al., Highly Reversible Lithium Storage in Nanostructured Silicon, *Electrochem Solid State Lett.*, vol. 6, Issue 9, pp. A194-A197 (Jul. 3, 2003).

Gratzel, M., Photoelectrochemical Cells, *Nature*, vol. 414, pp. 338-344 (Nov. 15, 2001).

Grimes, C.A., et al., Synthesis and Application of Highly Ordered Arrays of TiO2 Nanotubes, *J. Mater. Chem.*, vol. 17, Issue 15, pp. 1451-1457 (Apr. 21, 2007).

Gur, I., et al., Hybrid Solar Cells with Prescribed Nanoscale Morphologies Based on Hyperbranched Semiconductor Nanocrystals. *Nano Lett.*, vol. 7, pp. 409-414 (Dec. 29, 2006).

Hatchard, T.D., In Situ XRD and Electrochemical Study of the Reaction of Lithium with Amorphous Silicon, *Journal of the Electrochemical Society*, 151 (6) pp. A838-A842 (Apr. 30, 2004).

Hirahara, Eiji, The Electrical Conductivity and Isothermal Hall Effect in Cuprous Sulfide, Semi-Conductor, *Journal of the Physical Society of Japan*, vol. 6, No. 6, (Nov. 1951).

Hochbaum, Allon I., et al., Enhanced Thermoelectric Performance of Rough Silicon Nanowires, *Nature*, vol. 451, pp. 163-168 (Jan. 10, 2008).

Holmes, Justin D., Control of Thickness an Orientation of Solution-Grown Silicon Nanowires, *Science*, vol. 287, pp. 1471-1473 (Feb. 25, 2000).

Iannuzzi, M., et al., Surface Energies and Surface Relaxation at $TiSi_2$ Competing Phases, *Surface Science*, vol. 479, pp. 201-212 (May 20, 2001).

Jeon, H., et al., Morphology and Phase Stability of $TiSi_2$ *J. Appl. Phys.* 71 (9), p. 4269 (May 1, 1992).

Kanaras, A.G., et al., Controlled synthesis of hyperbranched inorganic nanocrystals with rich three-dimensional structures. *Nano Lett.*, vol. 5, No. 11, pp. 2164-2167 (Oct. 19, 2005).

Kang, Kibum, et al., The Role of $NiO_x$ Overlayers on Spontaneous Growth of $NiSi_x$ Nanowires from Ni Seed Layers, *Nano Letters*, vol. 8, No. 2, pp. 431-436 (Feb. 2008).

Kasavajjula, Uday, et al., Nano- and Bulk-Silicon-Based Insertion Anodes for Lithium-Ion Secondary Cells, *Journal of Power Sources*, 163, pp. 1003-1039 (Nov. 19, 2006).

Kayes, Brendan M., Comparison of the Device Physics Principles of Planar and Radial P-N Junction Nanorod Solar Cells, *Journal of Applied Physics* 97, Issue 11, p. 114302, (May 23, 2005).

Kim, C-J., et al., Spontaneous Chemical Vapor Growth of NiSi Nanowires and Their Metallic Properties. *Adv. Mater.*, vol. 19 (21), pp. 3637-3642 (Oct. 16, 2007).

Kim, H., et al., Superior Lithium Electroactive Mesoporous Si@Carbon Core-Shell Nanowires for Lithium Battery Anode Material, *Nano Letters*, vol. 8, No. 11, pp. 3688-3691 (Oct. 24, 2008).

Koncki, Robert, et al., Screen-Printed Copper Ion-Selective Electrodes, *Fresenius J. Anal. Chem.*, vol. 367, No. 4, pp. 393-395 (Jun. 2000).

Lao, J.Y., et al., Hierarchical ZnO Nanostructures. *Nano Lett.*, vol. 2, No. 11, pp. 1287-1291 (Sep. 13, 2002).

Law, Matt, et al., Nanowire Dye-Sensitized Solar Cells, Nature Materials, vol. 4, pp. 455-459 (Jun. 2005).

Lewis, N., et al., Powering the Planet: Chemical Challenges in Solar Energy Utilization, *Proc. Natl. Acad. Sci. U.S.A.*, vol. 103, No. 43, pp. 15729-15735 (Oct. 16, 2006).

Li, Hong, et al., A High Capacity Nano-Si Composite Anode Material for Lithium Rechargeable Batteries, *Electrochemical and Solid-State Letters*, 2 (11) pp. 547-549 (Sep. 1, 1999).

Li, K., et al., Identification of Refractory-Metal-Free C40 $TiSi_2$ for Low Temperature C54 $TiSi_2$ Formation, *App. Phys. Lett.* vol. 78, pp. 3989 (Jun. 18, 2001).

Libbrecht, Kenneth G., The Physics of Snow Crystals. *Rep. Prog. Phys.* 68, p. 855 (Mar. 8, 2005).

Lieber, C.M., Nanoscale Science and Technology: Building a Big Future from Small Things. *MRS Bull.* 28, p. 486 (Jul. 2003).

Lin, H.-K., et al., ChemInform Abstract: $Ti_5Si_3$ Nanowire and Its Field Emission Property, *Chem. Mater.* vol. 20, pp. 2429-2431 (Jun. 13, 2008).

Lin, Y., et al., $TiO_2/TiSi_2$ Heterostructures for High-Efficiency Photoelectrochemical $H_2O$ Splitting, J. Am. Chem. Soc., vol. 131, pp. 2772-2773 (Feb. 11, 2009).

Liu, Guangming, et al., Interface Properties and Band Alignment of $Cu_2S/CdS$ Thin Film Solar Cells, *Thin Solid Films*, vols. 431-432, pp. 477-482 (May 1, 2003).

Lukashev, Pavel, et al., Electronic and Crystal Structure of $Cu_2$-xS: Full-Potential Electronic Structure Calculations, *The American Physical Society, Physical Review* B, vol. 76, p. 195202 (Nov. 2, 2007).

Maiolo, J.R., High Aspect Ratio Silicon Wire Array Photoelectrochemical Cells, *J. Am. Chem. Soc.*, 129 (41), pp. 12346-12347 (Sep. 25, 2007).

Manna, L., et al., Controlled Growth of Tetrapod-Branched Inorganic Nanocrystals. *Nat Mater*, vol. 2, pp. 382-385 (May 30, 2003).

Maranchi, J.P., et al., High Capacity, Reversible Silicon Thin-Film Anodes for Lithium-Ion Batteries, *Electrochemical and Solid-State Letters*, vol. 6, Issue 9, A198-A201 (Jul. 15, 2003).

Meinardi, F., et al., Micro-Raman Study of the Factors Limiting the $TiSi_2$ C54 Phase Formation in Submicron Patterns. *Europhys. Lett.* 44 (1) pp. 57-61 (Oct. 1, 1998).

Mor, G., et al., p-Type Cu-Ti-O Nanotube Arrays and Their Use in Self-Biased Heterojunction Photoelectrochemical Diodes for Hydrogen Generation, *Nano Lett.*, vol. 8, No. 7, pp. 1906-1911 (Jun. 10, 2008).

Morita, Tomokazu, et al., Nano Si Cluster-$SiO_x$-C Composite Material as High-Capacity Anode Material for Rechargeable Lithium Batteries, *Journal of the Electrochemical Society*, 153 (2) A425-A430, (Jan. 6, 2006).

Murarka, S. P., et al., Refractory Silicides of Titanium and Tantalum for Low-Resistivity Gates and Interconnects. *IEEE Trans. on Electron Devices*, vol. ED-27, No. 8, pp. 1409-1417 (Aug. 1980).

Ohara, Shigeki, et al., Li Insertion/Extraction Reaction at a Si Film Evaporated on a Ni Foil, *Journal of Power Sources*, vols. 119-121, pp. 591-596 (Jun. 1, 2003).

O'Regan, B., et al., A Low-Cost, High-Efficiency Solar Cell Based on Dye-Sensitized Colloidal $TiO_2$ Films, *Nature*, vol. 353, pp. 737-740 (Oct. 24, 1991).

Pan, Z. W., et al, Nanobelts of Semiconducting Oxides, *Science*, vol. 291, p. 1947 (Mar. 9, 2001).

Park, J.H., et al. , Photoelectrochemical Water Splitting at Titanium Dioxide Nanotubes Coated with Tungsten Trioxide, *Appl. Phys. Lett.*, vol. 89, p. 163106 (Oct. 16, 2006).

Partain, L.D., Degradation of a $Cu_xS/CdS$ Solar Cell in Hot, Moist Air and Recovery in Hydrogen and Air, *J. Appl. Phys.*, vol. 54, No. 11, p. 6708 (Nov. 1983).

Pavasupree, S., et al., Synthesis and Dye-Sensitized Solar Cell Performance of Nanorods/Nanoparticles $TiO_2$ from High Surface Area Nanosheet $TiO_2$. *J. Nanosci. Nanotechnol.*vol. 6, No. 12, pp. 3685-3692(8) (Dec. 2006).

Peng, C.W., et al., Exposed Anatase $TiO_2$Nanosheets. *Chem. Mater.* vol. 20, p. 2426 (Mar. 7, 2008).

Pieraggi, B., et al., Stress Generation and Vacancy Annihilation During Scale Growth Limited by Cation-Vacancy Diffusion, *Acta Metall.*, vol. 36, No. 5, pp. 1281-1289 (May 1998).

Rahtu, A., et al., Reaction Mechanism Studies on Titanium Isopropoxide-Water Atomic Layer Deposition Process, *Chemical Vapor Deposition*, vol. 8, Iss. 1, pp. 21-28 (Jan. 18, 2002).

Ritterskamp, P., et al., A Titanium Disilicide Derived Semiconducting Catalyst for Water Splitting under Solar Radiation—Reversible Storage of Oxygen and Hydrogen. *Angew. Chem. Int. Ed.*, vol. 46 (41), pp. 7770-7774 (Oct. 15, 2007).

Robertson, R., et al., Silane Pyrolysis, *Chem. Phys.Lett.* vol. 103, No. 5, pp. 397-404 (Jan. 13, 1984).

Ryu, Ji Heon, et al., Failure Modes of Silicon Powder Negative Electrode in Lithium Secondary Batteries, *Electrochemical and Solid-State Letters*, 7 (10), A306-A309 (Sep. 3, 2004).

Santato, C., et al., Photoelectrochemical Properties of Nanostructured Tungsten Trioxide Films, *J. Phys. Chem. B.*, vol. 105, pp. 936-940 (Jan. 11, 2001).

Schmitt, A.L., et al., Chemical Synthesis and Magnetotransport of Magnetic Semiconducting $Fe_{1-x}Co_xSi$ Alloy Nanowires, *Nano Lett.*, vol. 8 (3), pp. 810-815 (Feb. 1, 2008).

Schmitt, A.L., et al., Metallic Single-Crystal CoSi Nanowires via Chemical Vapor Deposition of Single-Source Precursor. *J. Phys. Chem. B*, vol. 110, pp. 18142-18146 (Aug. 26, 2006).

Schmitt, A.L., et al., Selective Patterned Growth of Silicide Nanowires Without the Use of Metal Catalysts. *Chem. Mater.*, vol. 19, pp. 126-128 (Dec. 22, 2006).

Sherman, A. Thermal CVD of Metallic Conductors, In *Chemical Vapor Deposition for Microelectronics, Principles, Technology, and Applications*; William Andrew Inc.: Norwich, NY, Chapter 4, pp. 92-118 (1987).

Shu, Jie, et al., Cage-Like Carbon Nanotubes/Si Composite as Anode Material for Lithium Ion Batteries, *Electrochemistry Communications* vol. 8, pp. 51-54 (Nov. 17, 2005).

Sigman, Michael B., Jr., et al., Solventless Synthesis of Monodisperse Cu2S Nanorods, Nanodisks, and Nanoplatelets, *J. Am. Chem. Soc.*, vol. 125, No. 51, (Dec. 24, 2003).

Song, Y.P., et al., Ultralong Single-Crystal Metallic $Ni_2Si$ Nanowires with Low Resistivity, *Nano Lett.*, vol. 7 (4), pp. 965-969 (Mar. 27, 2007).

Sullivan, John P., et al., The Effects of Varying Humidity on Copper Sulfide Film Formation, *Sand Report*, Sand2004-0670, Unlimited Release (Feb. 2004).

Szczech, J.R., et al., Single-Crystal Semiconducting Chromium Disilicide Nanowires Synthesized Via Chemical Vapor Transport. *Chem. Mater.*, vol. 19, pp. 3238-3243 (May 25, 2007).

Tada, H., et al., All Solid-State Z-Scheme in CdS-Au-$TiO_2$ Three-Component Nanojunction System, *Nat. Mater.*, Advance Online Publication, 1-5 (Sep. 10, 2006).

Takamura, Tsutomu, et al., A Vacuum Deposited Si Film Having a Li Extraction Capacity Over 2000 mAh/g With a Long Cycle Life, *Journal of Power Sources*, vol. 129, pp. 96-100 (Jan. 18, 2004).

Tarascon, J.M., et al., Issues and Challenges Facing Rechargeable Lithium Batteries, *Nature*, vol. 414, (Nov. 15, 2001).

Tian, B., et al., Coaxial Silicon Nanowires as Solar Cells and Nanoelectronic Power Sources, *Nature*, vol. 449, pp. 885-890 (Oct. 18, 2007).

Varadwaj, J.S.K., et al., Phase-Controlled Growth of Metastable $Fe_5Si_3$ Nanowires by a Vapor Transport Method, *J. Am. Chem. Soc.* vol. 129 (27), pp. 8594-8599 (Jun. 14, 2007).

Varghese, Oomman K., et al., Appropriate Strategies for Determining the Photoconversion Efficiency of Water Photoelectrolysis Cells: A Review with Examples Using Titania Nanotube Array Photoanodes, *Sol. Energy Mater. Sol. Cells*, vol. 92, Iss. 4, pp. 374-384, (Apr. 2008).

Varghese, Oomman K., et al., Long Vertically Aligned Titania Nanotubes on Transparent Conducting Oxide for Highly Efficient Solar Cells, *Nature Nanotechnology*, vol. 4, (Sep. 2009).

Wagner, R.S., et al., Vapor-Liquid-Solid Mechanism of Single Crystal Growth, *Applied Physics Letters*, vol. 4, No. 5, p. 89 (Mar. 1, 1964).

Wang, D., et al., Nanocrystals Branch Out. *Nat Mater.*, vol. 2, pp. 355-356 (Jun. 2003).

Wang, D., et al., Rational Growth of Branched and Hyperbranched Nanowire Structures. *Nano Lett.*, vol. 4, No. 5, pp. 871-874 (Mar. 31, 2004).

Wang, Donghai, et al., Self-Assembled $TiO_2$-Graphene Hybrid Nanostructures for Enhanced Li-Ion Insertion, *ACS Nano*, vol. 3, No. 4, pp. 907-914 (Mar. 26, 2009).

Wang, D., et al., Two-Dimensional Single-Crystal Nanowire Arrays, *Small*, vol. 3, No. 12, pp. 2043-2047 (Nov. 20, 2007).

Wang, G.X., et al., Nanostructured Si-C Composite Anodes for Lithium-Ion Batteries. *Electrochemistry Communications* 6, pp. 689-692 (Jun. 2, 2004).

Wang, Suhua, et al., Growth of Crystalline Cu2S Nanowire Arrays on Copper Surface: Effect of Copper Surface Structure, Reagent Gas Composition, and Reaction Temperature, *Chem Mater.* vol. 13, pp. 4794-4799 (Nov. 30, 2001).

Wang, T., et al., Ab Initio Comparative Study of C54 and C49 $TiSi_2$ Surfaces. *Appl. Surf. Sci.* vol. 252, p. 4943 (Sep. 8, 2005).

Wu, Y., et al., Single-Crystal Metallic Nanowires and Metal/Semiconductor Nanowire Heterostructures. *Nature*, vol. 430, pp. 61-65 (Jul. 1, 2004).

Wu, Y., et al., Synthesis and Photovoltaic Application of Copper(1) Sulfide Nanocrystals, *Nano Letters*, vol. 8, No. 8, pp. 2551-2555 (Aug. 13, 2008).

Xia, Y.N., et al., One-Dimensional Nanostructures: Synthesis, Characterization, and Applications. *Adv. Mater.*, vol. 15, No. 5, p. 353 (Mar. 4, 2003).

Xiang, B., et al., Synthesis and Field Emission Properties of $TiSi_2$ Nanowires. *Appl. Phys. Lett.*, vol. 86, p. 243103 (Jun. 7, 2005).

Yan, H., et al., Dendritic Nanowire Ultraviolet Laser Array. *J. Am. Chem. Soc.* vol. 125, pp. 4728-4729 (Mar. 29, 2003).

Yoshio, M., et al., Electrochemical Behaviors of Silicon Based Anode Material, Journal of Power Sources vol. 146 pp. 10-14 (Jun. 1, 2005).

Zhang, H.L., et al., The Facile Synthesis of Nickel Silicide Nanobelts and Nanosheets and Their Application in Electrochemical Energy Storage, *Nanotechnology*, vol. 19, 165606 (7 pp.) (Mar. 20, 2008).

Zhang, Weixin, et al., In Situ Fabrication of Inorganic Nanowire Arrays Grown from and Aligned on Metal Substrates, *Acc. Chem. Res.*, vol. 42 (10), pp. 1617-1627 (Oct. 20, 2009).

Zhao, H.Z., et al., Influence of Pressure on Silicon Nanowire Growth Kinetics, C, *J. Phys. Chem. C*, vol. 112 (15), pp. 5695-5698 (Mar. 25, 2008).

Zhou, S., et al., Rational Synthesis and Properties of Complex $TiSi_2$ Nanostructures, *Chem. Mater.*, vol. 21 (6) pp. 1023-1027 (Feb. 11, 2009).

Zhou, S., et al., Spontaneous Growth of Highly Conductive Two-Dimensional Single-Crystalline $TiSi_2$ Nanonets, *Angew. Chem. Int. Ed.* vol. 47, pp. 7681-7684 (Sep. 2, 2008).

Zhu, Kai, et al., Removing Structural Disorder from Oriented $TiO_2$ Nanotube Arrays: Reducing the Dimensionality of Transport and Recombination in Dye-Sensitized Solar Cells, *Nano Letters*, vol. 7, No. 12, pp. 3739-3746 (Nov. 6, 2007).

Bryant, W. A., "Review-The Fundamentals of Chemical Vapour Deposition", *Journal of Materials Science* 12 pp. 1285-1306 (Jul. 1977).

PCT International Search Report based on PCT/US09/054864 dated Oct. 28, 2009.

\* cited by examiner

METHODS OF FABRICATING COMPLEX TWO-DIMENSIONAL CONDUCTIVE SILICIDES

RELATED APPLICATIONS

This application claims the benefit of and priority to U.S. Provisional Application Ser. No. 61/091,570, filed Aug. 25, 2008, the entirety of this application is hereby incorporated herein by reference.

FIELD

The embodiments disclosed herein relate to the fabrication of complex two-dimensional conductive nanostructures, and more particularly to the fabrication of complex two-dimensional conductive silicide nanostructures by a chemical vapor deposition method.

BACKGROUND

Simple nanostructures (e.g. nanowires) form complex nanomaterials when connected by single crystalline junctions, offering better mechanical strength and superior charge transport while preserving unique properties associated with the small dimensions. Great research interest has been attracted to study this new class of materials, especially in the field of electronics and energy applications. Synthesis of these materials is challenging, necessitated by the combined features of low dimensionality and high complexity; the former requires growth suppressions whereas the latter demands growth enhancement. To this end, two-dimensional complex nanostructures are exceedingly difficult to grow chemically.

SUMMARY

Complex two-dimensional conductive silicide nanostructures and methods of fabricating the nanostructures are disclosed.

According to aspects illustrated herein, there is provided a conductive silicide that includes a plurality of connected and spaced-apart nanobeams linked together at an about 90-degree angle, the plurality of nanobeams forming a two-dimensional nanostructure having a mesh-like appearance. In an embodiment, the plurality of nanobeams are flexible. In an embodiment, the silicide has an electrical resistivity of approximately 10 $\mu\Omega\cdot$cm. In an embodiment, the conductive silicide can be used in a nanoelectronics device. In an embodiment, the conductive silicide can be used in an energy-related device. In an embodiment, the conductive silicide can be used in a planar electronic device. In an embodiment, the conductive silicide can be used in an optoelectronics device. In an embodiment, the conductive silicide can be used in a nanophotonics device.

According to aspects illustrated herein, there is provided a conductive silicide nanostructure comprising a plurality of two-dimensional nanonet sheets, wherein each of the nanonet sheets include connected and spaced-apart nanobeams linked together at an about 90-degree angle. In an embodiment, the plurality of nanonet sheets are stacked approximately horizontally. In an embodiment, the plurality of nanonet sheets have an electrical resistivity of approximately 10 $\mu\Omega\cdot$cm.

According to aspects illustrated herein, there is provided a method of fabricating a two-dimensional conductive silicide that includes performing chemical vapor deposition, wherein one or more gas or liquid precursor materials carried by a carrier gas stream react to form a nanostructure having a mesh-like appearance and including a plurality of connected and spaced-apart nanobeams linked together at an about 90-degree angle.

BRIEF DESCRIPTION OF THE DRAWINGS

The presently disclosed embodiments will be further explained with reference to the attached drawings, wherein like structures are referred to by like numerals throughout the several views. The drawings shown are not necessarily to scale, with emphasis instead generally being placed upon illustrating the principles of the presently disclosed embodiments.

FIG. 2A is a scanning electron micrograph (SEM) of the 2D conductive $TiSi_2$ nanostructure. The nanostructure is composed of a plurality of nanonet (NN) sheets. FIG. 2B is a transmission electron micrograph (TEM) showing a single NN sheet of the 2D conductive $TiSi_2$ nanostructure. Each NN has a complex structure made up of nanobeams that are linked together by single crystalline junctions with 90° angles. FIGS. 2(C-E) show a series of tilted transmission electron micrographs, and corresponding schematics, of the NN structure.

FIG. 4(A-C) show high-resolution transmission electron micrographs (HRTEMs) of the single nanobeam highlighted from FIG. 2B. The entire nanobeam is single crystalline, including the joint (FIG. 4A), the middle (FIG. 4B) and the end (FIG. 4C). To better show the atomic arrangements in the HRTEMs, noise reduction by inversed fast Fourier transform (iFFT) was performed. FIG. 4D shows that noise reduction by inverse Fast Fourier Transform (iFFT) in selected regions show the Ti and Si atomic arrangements in excellent agreement with simulated ones (white-framed inset). Schematic atomic arrangements viewed from <010> direction is shown in the top-left inset of FIG. 4D. XPS peaks of Cl, Si and Ti with peak fittings are plotted in FIG. 4E. FIG. 4F shows the NN sheet of FIG. 2C, where the width of the sheet is about 15 nm.

FIG. 7A is a scanning electron micrograph showing $TiSi_2$ nanowebs (NWs) in the form of intersecting nanowires fabricated by altering the processing parameters of the method of the presently disclosed embodiments. FIG. 7B is a transmission electron micrograph of the $TiSi_2$ NWs. FIG. 7C is a Raman spectroscopy analysis showing that $TiSi_2$ NWs are C54 and that $TiSi_2$ NN sheets are C49.

FIG. 9(A-B) show a scanning tunneling microscopy (STM) setup. FIG. 9C shows a tunneling current versus sample voltage (I-V) curve for the complex 2D conductive $TiSi_2$ nanostructures. FIG. 9D shows how annealing by passing a constant current at a large bias helps form Ohmic contacts between the STM tip and the $TiSi_2$ nanostructures.

Figure 1:
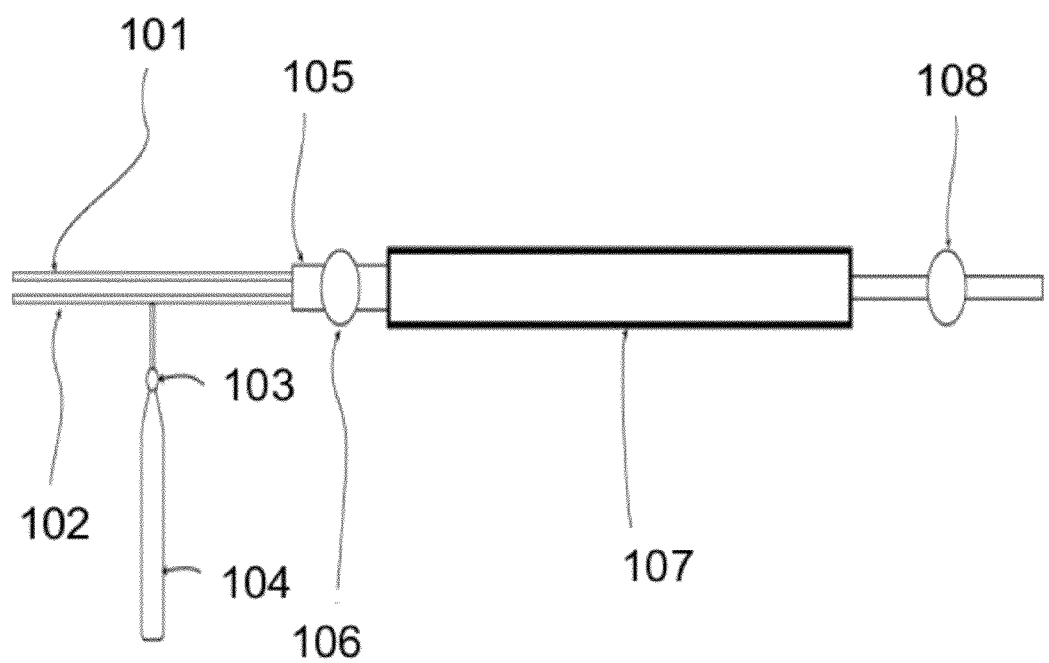
FIG. 1 is a schematic representation of a chemical vapor deposition (CVD) apparatus used for an embodiment of a method of fabricating complex two-dimensional (2D) conductive silicide nanostructures of the present disclosure.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

Silicides are highly conductive materials formed by alloying silicon with selected metals. They are commonly used in Si integrated circuits to form ohmic contacts. The most frequently used silicides in advanced integrated circuits are silicides of titanium ($TiSi_2$), cobalt ($CoSi_2$), and nickel ($NiSi$). Titanium silicide ($TiSi_2$) is an excellent electronic material and is one of the most conductive silicides (resistivity of about 10 micro-ohm-centimeters ($\mu\Omega\cdot cm$)). $TiSi_2$ has recently been demonstrated to behave as a good photocatalyst to split water by absorbing visible lights, a promising approach toward solar $H_2$ as clean energy carriers. Better charge transport offered by complex structures of nanometer-scaled $TiSi_2$ is desirable for nanoelectronics and solar energy harvesting. Capabilities to chemically synthesize $TiSi_2$ are therefore appealing. Synthetic conditions required by the two key features of complex nanostructures, low dimensionality and complexity, however, seem to contradict each other. Growth of one-dimensional (1D) features involves promoting additions of atoms or molecules in one direction while constraining those in all other directions, which is often achieved either by surface passivation to increase energies of sidewall deposition (such as solution phase synthesis) or introduction of impurity to lower energies of deposition for the selected directions (most notably the vapor-liquid-solid mechanism). Complex crystal structures, on the other hand, require controlled growth in more than one direction. The challenge in making two-dimensional (2D) complex nanostructures is even greater as it demands more stringent controls over the complexity to limit the overall structure within two dimensions. The successful chemical syntheses of complex nanostructures have been mainly limited to three-dimensional (3D) ones. In principle, 2D complex nanostructures are less likely to grow for crystals with high symmetries, e.g. cubic, since various equivalent directions tend to yield a 3D complex structure; or that with low symmetries, e.g. triclinic, monoclinic or trigonal, each crystal plane of which is so different that simultaneous growths for complexity are prohibitively difficult.

Methods of fabricating 2D conductive silicide nanostructures are disclosed herein. In an embodiment, the 2D conductive silicide nanostructures are free-standing nanostructures. In an embodiment, the nanostructures are single crystalline complex 2D networks composed of a plurality of nanonet (NN) sheets, formed by optimizing various processing parameters during fabrication. In an embodiment, the nanostructures include a plurality of nanonet sheets that are stacked on top of each other. In an embodiment, the nanonet sheets are stacked approximately horizontally to each other. In an embodiment, each nanonet sheet is a complex structure made up of nanobeams that are linked together by single crystalline junctions with 90-degree angles. In an embodiment, each nanobeam is approximately 15 nm thick, 20-30 nm wide, and at least about 1 µm long. Crystals with hexagonal, tetragonal, and orthorhombic lattices are good choices for 2D complex nanostructures of the present disclosure.

The following definitions are used to describe the various aspects and characteristics of the presently disclosed embodiments.

As used herein, the term "CVD" refers to chemical vapor deposition. In CVD, gaseous mixtures of chemicals are dissociated at high temperature (for example, $CO_2$ into C and $O_2$). This is the "CV" part of CVD. Some of the liberated molecules can then be deposited on a nearby substrate (the "D" in CVD), with the rest pumped away. Examples of CVD methods include but are not limited to, "plasma enhanced chemical vapor deposition" (PECVD), "hot filament chemical vapor deposition" (HFCVD), and "synchrotron radiation chemical vapor deposition" (SRCVD).

As used herein, the term "electrical resistivity" refers to a measure of how strongly a nanostructure of the presently disclosed embodiments opposes the flow of electric current.

As used herein, the term "mesh-like appearance" or "nanonet appearance" refers to a complex 2D nanostructure of the presently disclosed embodiments fabricated to form a plurality of connected nanobeams of conductive silicide. The nanobeams making up the nanostructure can exist either parallel or perpendicular to another nanobeam(s). The nanobeam(s) that are perpendicular to other nanobeam(s) are at an about 90-degree angle to one another. Spaces exist between nanobeams, forming the mesh-like appearance. The entire nanostructure is single crystalline.

Structural stability improvements achieved by the methods of the presently disclosed embodiments results in a significant increase in conductivity as compared to bulk C49 $TiSi_2$. The 2D conductive silicide nanostructures of the presently disclosed embodiments show remarkable mechanical integrity and good electrical conductivity. In an embodiment, the 2D conductive silicide nanostructures of the present disclosure can be used in the field of nanoelectronics, where the nanostructures represent dimensions and complexities far beyond that can be reached by lithography methods. This will lead to significant progress of electronics miniaturizations. In an embodiment, the 2D conductive silicide nanostructures of the present disclosure can be used for developing energy-related devices such as solar cells and batteries, benefited from the new structures and outstanding electrical conductivities achieved. Planar electronic devices made using the 2D conductive silicide nanostructures of the presently disclosed embodiments can be employed as ultra-sensitive sensors, which will be useful in chemical detection and medical diagnosis. In an embodiment, the 2D conductive silicide nanostructures of the present disclosure act as nano-antennas, and can be used for optoelectronics and nanophotonics applications. In an embodiment, the 2D conductive silicide nanostructures of the present disclosure find use as a fractal antenna.

The methods disclosed herein generate novel complex 2D conductive silicide nanostructures by optimizing various process parameters during fabrication. In an embodiment, careful control of the feeding of the synthesis precursors is necessary for obtaining the nanostructures disclosed herein. Inbalanced feeding of either the precursors or the overall concentration in the reaction chamber, can lead to failed growth of the nanostructures. In an embodiment, careful control of the carrier gas is necessary for obtaining the nanostructures disclosed herein, as the carrier gas reacts with both precursors, as well as acts as a protecting gas by providing a reductive environment.

An important distinguishing characteristic of the methods disclosed herein is that the nanostructres are spontaneously formed, without the need for supplying growth seeds. This eliminates the limitations that many other nanostructure synthesis methods require, and thus extend the nanostructures applications in fields where impurities (from hetergeneous growth seeds) are detrimental. The substrates that the disclosed nanostructures can be grown on are versatile, so long as the substrate sustains the temperatures required for the synthesis. In an embodiment, the nanostructures are grown on a transparent substrate. The nanostructures fabricated according to the methods of the presently disclosed embodiments can provide superior conductivity, excellent thermal and mechanical stability, and high surface area.

In an embodiment, the 2D conductive silicide nanostructures are titanium silicide nanostructures. The following detailed description will focus on the fabrication of 2D titanium silicide ($TiSi_2$) nanostructures. However, it should be noted that other 2D conductive silicide nanostructures can be fabricated using the methods of the presently disclosed embodiments, including, but not limited to, nickel silicide, iron silicide, platinum silicide, chromium silicide, cobalt silicide, molybdenum silicide and tantalum silicide.

FIG. 1 shows a CVD system 100 used for an embodiment of a method of fabricating 2D conductive nanostructures of the present disclosure. The CVD system 100 has automatic flow and pressure controls. Flow of a precursor gas and a carrier gas are controlled by mass flow controllers 101 and 102 respectively, and fed to a growth (reaction) chamber 107 at precise flow rates. The flow rate for the precursor gas is between about 20 standard cubic centimeters per minute (sccm) and about 100 sccm. In an embodiment, the flow rate for the precursor gas is about 50 sccm. In an embodiment, the precursor gas is present at a concentration ranging from about $1.3 \times 10^{-6}$ mole/L to about $4.2 \times 10^{-6}$ mole/L. In an embodiment, the precursor gas is present at a concentration of about $2.8 \pm 1 \times 10^{-6}$ mole/L. The flow rate for the carrier gas is between about 80 standard cubic centimeters per minute (sccm) and about 130 sccm. In an embodiment, the flow rate for the carrier gas is about 100 sccm. A precursor liquid is stored in a cylinder 104 and released to the carrier gas mass flow controller 102 through a metered needle control valve 103. The flow rate for the precursor liquid is between about 1.2 sccm and 5 sccm. In an embodiment, the flow rate for the precursor liquid is about 2.5 sccm. In an embodiment, the precursor liquid is present at a concentration ranging from about $6.8 \times 10^{-7}$ mole/L to about $3.2 \times 10^{-6}$ mole/L. In an embodiment, the flow rate for the precursor liquid is present at a concentration of about $1.1 \pm 0.2 \times 10^{-6}$ mole/L. All precursors are mixed in a pre-mixing chamber 105 prior to entering the reaction chamber 107. The pressure in the reaction chamber 107 is automatically controlled and maintained approximately constant by the combination of a pressure transducer 106 and a throttle valve 108. In an embodiment, the system 100 is kept at a constant pressure of about 5 Torr during growth. The variation of the pressure during a typical growth is within 1% of a set point. All precursors are kept at room temperature before being introduced into the reaction chamber 107. A typical reaction lasts from about five minutes up to about twenty minutes. The reaction chamber 107 is heated by a horizontal tubular furnace to temperature ranging from about 650° C. to about 685° C. In an embodiment, the reaction chamber 107 is heated to a temperature of about 675° C.

In an embodiment, the precursor liquid is a titanium containing chemical. Examples of titanium containing chemicals include, but are not limited to, titanium beams from high temperature (or electromagnetically excited) metal targets, titanium tetrachloride ($TiCl_4$), and titanium-containing organomettalic compounds. In an embodiment, the precursor gas is a silicon containing chemical. Examples of silicon containing chemicals include, but are not limited to, silane ($SiH_4$), silicon tetrachloride ($SiCl_4$), disilane ($Si_2H_6$), other silanes, and silicon beams by evaporation. In an embodiment, the carrier gas is selected from the group consisting of hydrogen (H), hydrochloric acid (HCl), hydrogen fluoride (HF), chlorine ($Cl_2$), fluorine ($F_2$), and an inert gas.

The 2D conductive silicide nanostructures disclosed herein are spontaneously fabricated in the chemical vapor deposition system 100 when the precursors react and/or decompose on a substrate in the growth chamber 107. This spontaneous fabrication occurs via a seedless growth, i.e., no growth seeds are necessary for the growth of the 2D conductive silicide nanostructures. Therefore, impurities are not introduced into the resulting nanostructures. The fabrication method is simple, no complicated pre-treatments are necessary for the receiving substrates. The growth is not sensitive to surfaces (i.e., not substrate dependent). The substrates that the disclosed nanostructures can be grown on are versatile, so long as the substrate sustains the temperatures required for the synthesis. In an embodiment, the 2D conductive silicide nanostructures are grown on a transparent substrate. No inert chemical carriers are involved (the carrier gas also participates the reactions). It is believed that due to the nature of the synthesis of the 2D conductive silicide nanostructures disclosed herein, a continuous synthesis process may be developed to allow for roll-to-roll production.

Fabrication of Complex 2D Conductive $TiSi_2$ Nanostructures

A chemical vapor deposition system, as described above and shown in FIG. 1, was used for fabricating a complex 2D conductive $TiSi_2$ nanostructure of the presently disclosed embodiments. Briefly, $SiH_4$ was selected as the precursor gas, $H_2$ was selected as the carrier gas, and $TiCl_4$ was selected as the precursor liquid. Fifty (50) standard cubic centimeter per minute (sccm) of $SiH_4$ (10% diluted in He) and $TiCl_4$ vapor with an equivalent flow of two-and-a-half (2.5) sccm is transported by one hundred (100) sccm $H_2$ flow. All precursors were kept at room temperature before being introduced into the reaction chamber that was heated to about 675° C. with temperatures with ±1° C. accuracy. The system was kept at a constant pressure of about 5 Torr during growth, and the reaction lasted approximately fifteen (15) minutes.

Figure 2:
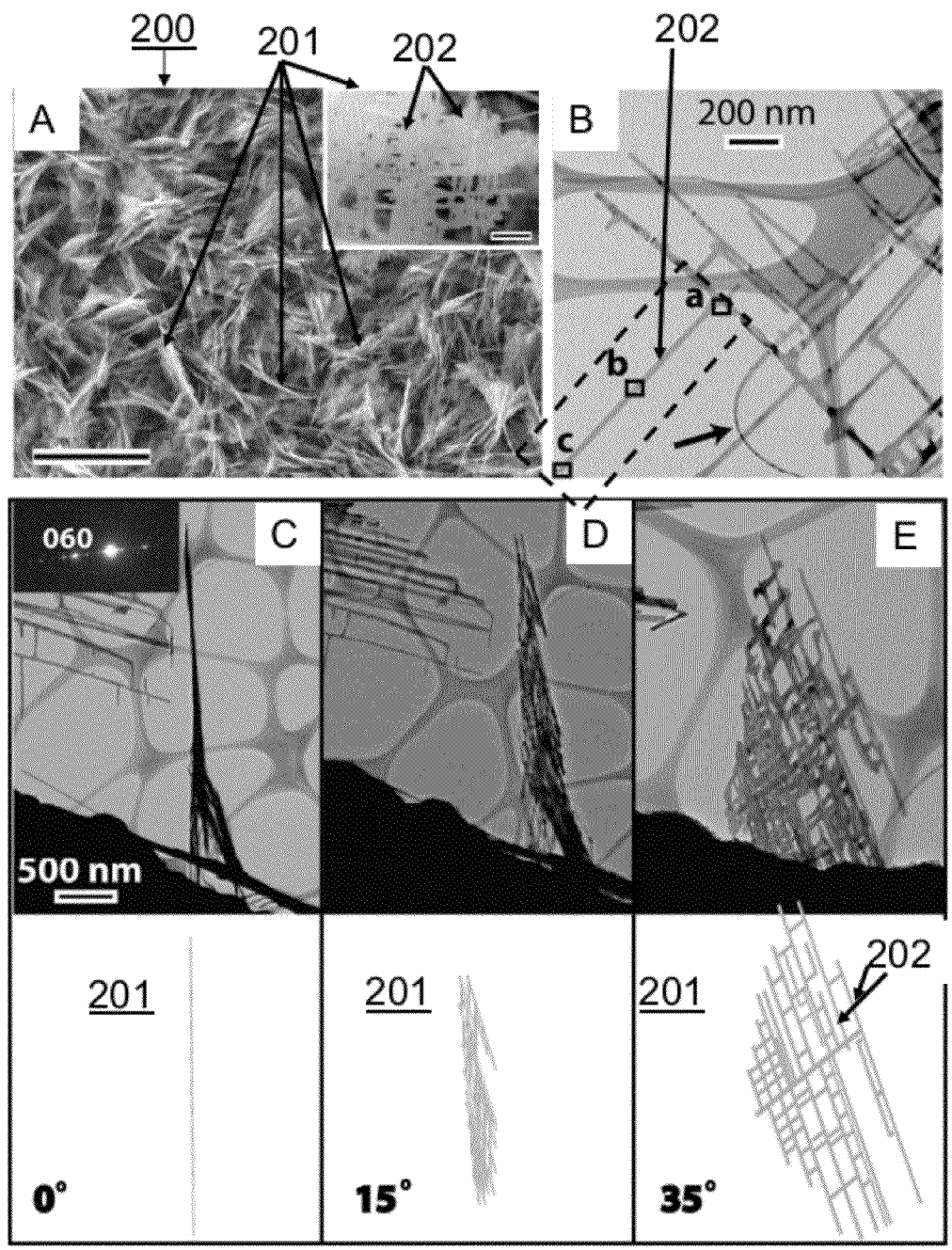
FIG. 2(A-E) show electron micrographs of a complex 2D conductive titanium silicide ($TiSi_2$) nanostructure fabricated according to the methods of the presently disclosed embodiments.

FIG. 2 shows electron micrographs of the complex 2D conductive TiSi$_2$ nanostructure 200 fabricated as described above. FIG. 2A is a scanning electron micrograph showing the complex nanostructure 200. The nanostructure 200 is composed of a plurality of nanonet (NN) sheets 201. At relatively low magnifications, the nanostructure 200 packs to resemble tree leaves, except that each NN sheet 201 is composed of nanobeams 202, as revealed by the close-up inset. (Scale bars: 5 μm in main frame, and 100 nm in the inset). The nanostructure 200 is better seen under transmission electron microscope, FIG. 2B. Within each of the NN sheets 201 are approximately 25 nm wide and approximately 15 nm thick nanobeams 202, all linked together by single crystalline junctions with 90° angles. One of the frames is twisted at the bottom of the picture (arrow), demonstrating belt-like characteristics.

Figure 3:
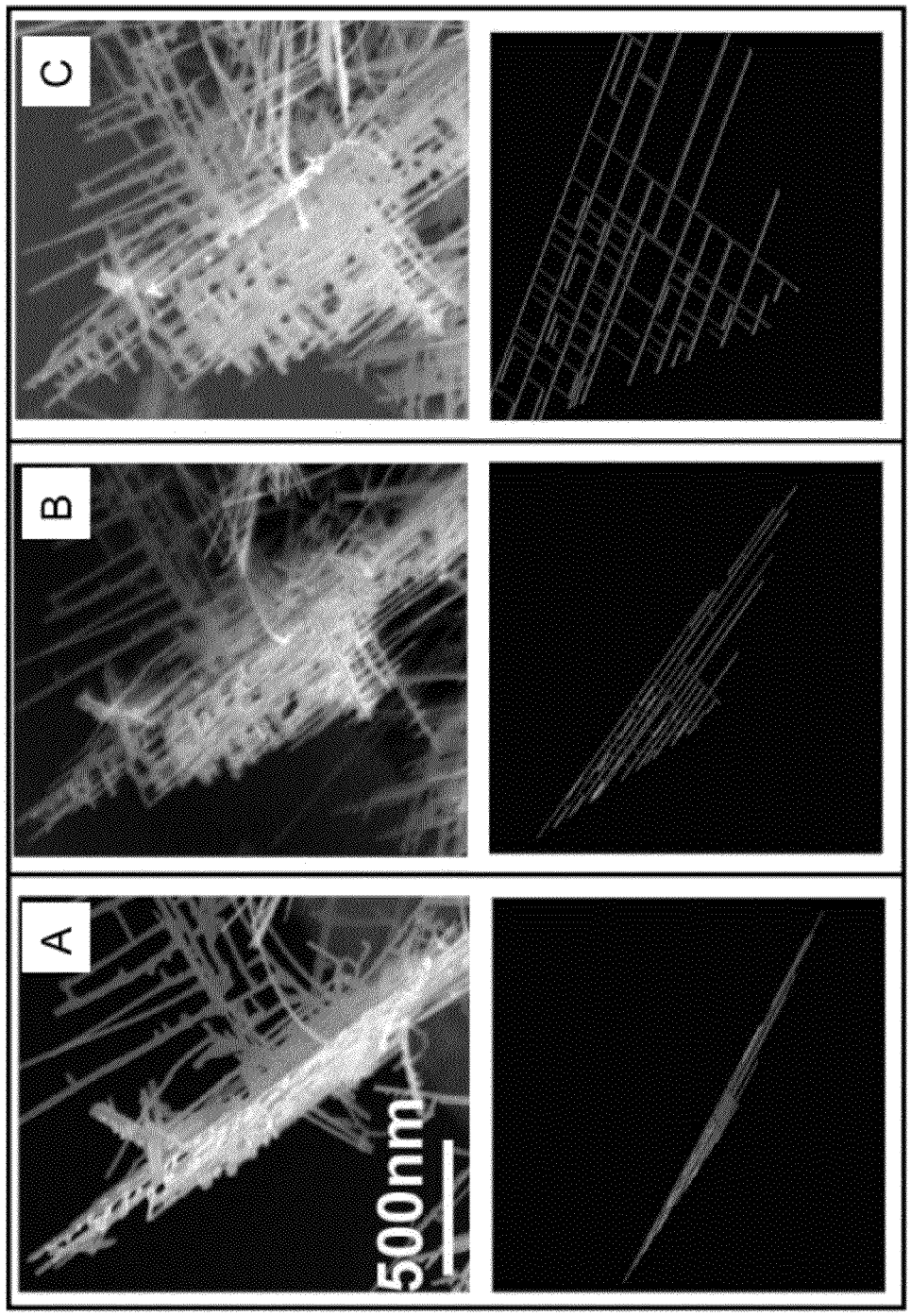
FIG. 3(A-C) show a series of tilted scanning electron micrographs (top images), viewed at 0°, 15° and 30°, respectively, and corresponding schematics (bottom images) of a single NN sheet from a complex 2D conductive titanium silicide ($TiSi_2$) nanostructure fabricated according to the methods of the presently disclosed embodiments.

A series of tilted transmission electron micrographs confirm the 2D characteristics of each of the NN sheets 201, as shown in FIG. 2C-2E. The inset electron diffraction pattern in FIG. 2C was on the NN sheets 201 in the vertical orientation, revealing the single crystalline nature of the NN sheets 201, and that the plane of the NN sheets 201 is perpendicular to <010> directions (presence of strong diffraction spot of (060)). Similar series of tilted images using the scanning electron microscope, see FIG. 3A-C, shows similar results. As best seen in FIG. 9B, 2D TiSi$_2$ NN sheets 901 bend and roll up when pushed by a S™ tip 910 during TEM characterization, further verifying the 2D nature and suggesting that the nanostructures are highly flexible as a result of the thinness.

Figure 4:
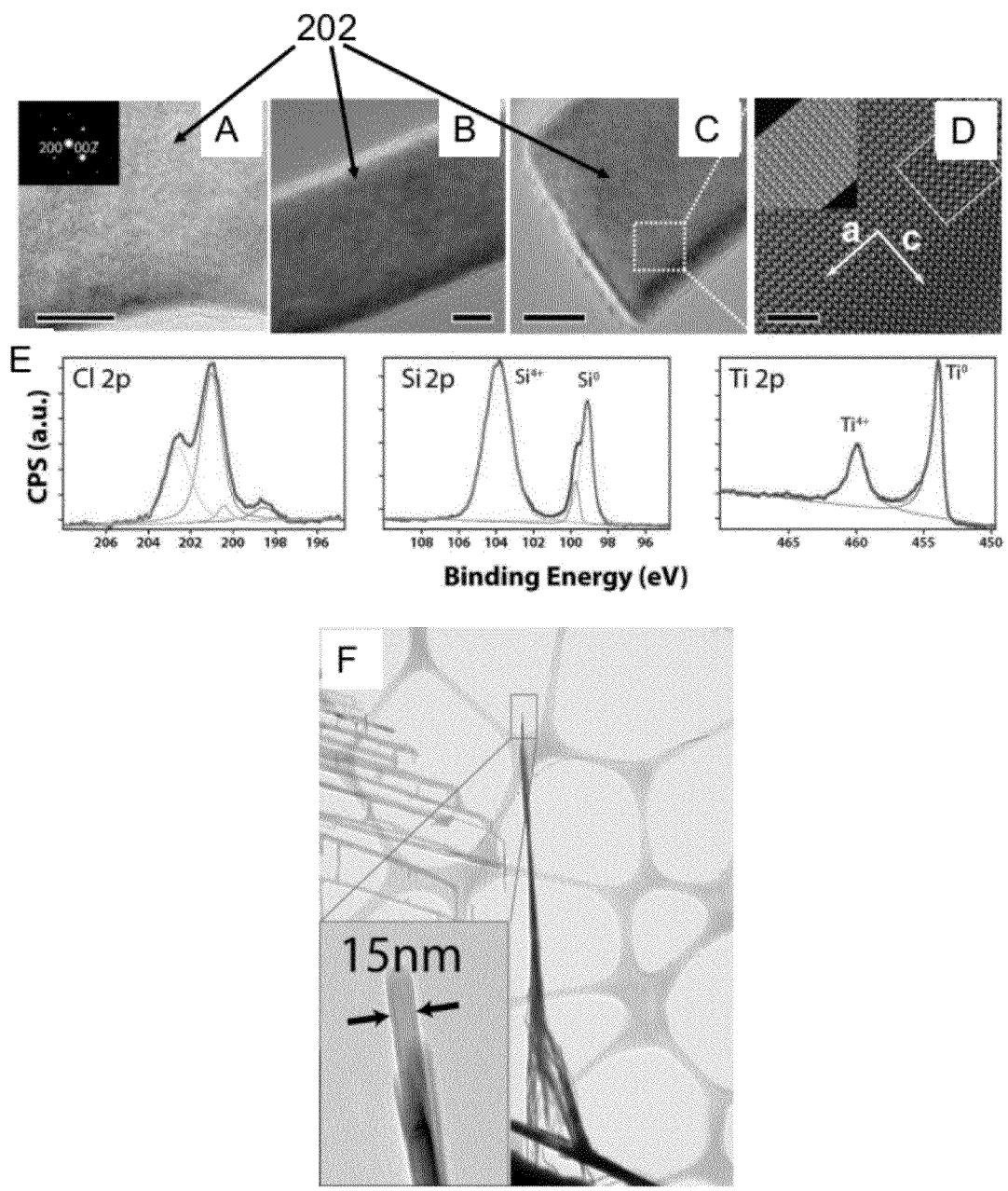
FIG. 4(A-F) show transmission electron micrographs of the complex 2D conductive titanium silicide ($TiSi_2$) nanostructure shown in FIG. 2, as well as X-ray photoelectron spectroscopy (XPS) peaks of Cl, Si and Ti from the nanostructure.

High resolution transmission electron microscopy images and electron diffraction (ED) patterns of different regions of the nanobeam 202 from FIG. 2B, reveal that the entire nanobeam 202 structure is single crystalline, including the 90° joints (FIG. 4A), the middle (FIG. 4B) and the ends (FIG. 4C). The ends of the nanobeams 202 within any NN sheet 201, are free of impurities, FIG. 4C. Scale bars for FIG. 4A is 5 nm, FIG. 4B is 5 nm, FIG. 4C is 5 nm, and FIG. 4D is 2 nm. The frames are nanobelts based on two main observations: loose ends often bend on TEM supporting films, showing characteristics of nanobeams (see arrow in FIG. 2B), and the thickness of a NN sheet (approximately 15 nm) is thinner than the width of a NN sheet (approximately 25 nm), as evidenced in the tilted TEM image (FIG. 2C, FIG. 3A, and FIG. 4F).

Figure 6:
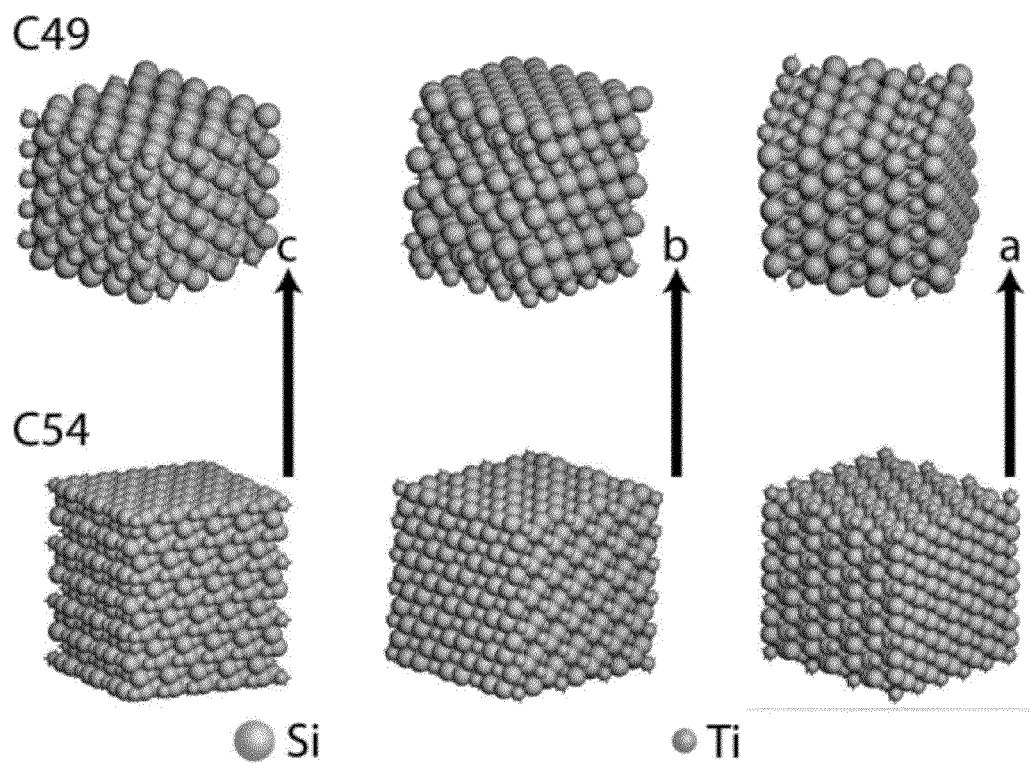
FIG. 6 show schematic representations of atoms arranged in $TiSi_2$ viewed from different perspectives. The difference between C49 (top) and C54 (bottom) lies in the existence of pure Si layers perpendicular to the b axis in the atomic structure.

Further analyses of HRTEM images and associated selected-area electron diffraction (SAED) patterns show that the NN sheets 201 are C49 structure with the b axis perpendicular to the plane (see FIG. 2C, and FIG. 3A). That is, the NN sheets 201 primarily grow along a and c directions. Using a NN sheet having dimensions of 2 μm wide and long and 15 nm thick as an example, the growth selectivity of different crystal directions (a/b or c/b, i.e. width/thickness)>100, a remarkable ratio considering that no growth seeds are involved. Without being bound by any particular theory, this can be explained by the orthorhombic symmetry of C49 TiSi$_2$ and corresponding atomic arrangements. In a conventional C49 TiSi$_2$ unit cell (a=3.62 Å, c=3.61 Å and b=13.76 Å), there exist atomic layers entirely composed of Si along b direction, which are less susceptible to depositions of TiSi$_2$ required for continuous crystal growth (see, FIG. 6). The Si layer is further passivated by —Cl terminations to protect the {010} planes from additional growth, as confirmed by X-ray photoelectron spectroscopy (XPS), see FIG. 4E. XPS spectra from the TiSi$_2$ NN sheets were taken with an Al K-alpha irradiation source (1486.69 eV) using a Kratos AXIS Ultra Imaging X-ray Photoelectron Spectrometer with 0.1 eV resolution. An internal C 1 s standard was utilized to calibrate the binding energies. Composition analysis by XPS shows that Si:Ti ratio on the surface is much greater than 2. This confirms that Si contents are richer on the surface, suggesting Si terminations. In contrast, other planes such as {100} and {001} are always composed of both Ti and Si atoms, favoring additions of both chemical species and leading to highly anisotropic growth. As a result, 2D structures are created by promoted growth of {100} and {001} planes and inhibited depositions on the {010} planes.

Figure 8:
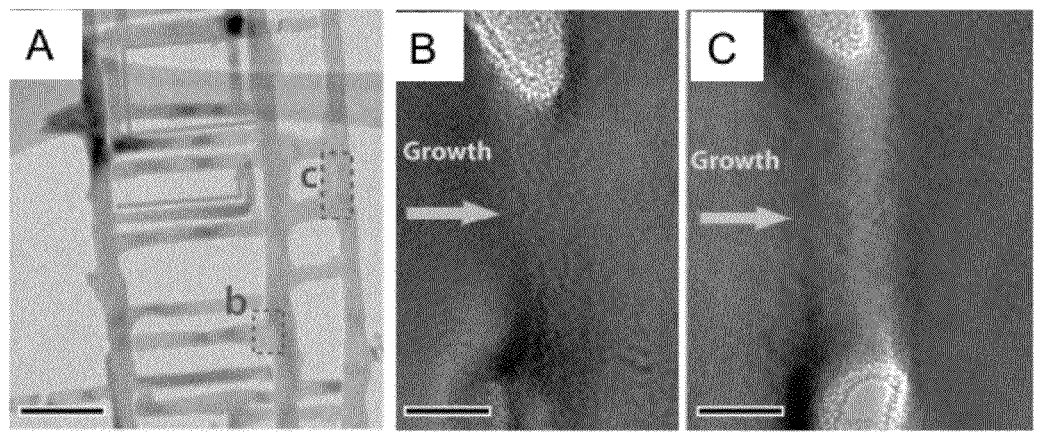
FIG. 8(A-C) show transmission electron micrographs of kinks and melting phenomenon observed in a complex 2D conductive $TiSi_2$ nanostructure fabricated according to the methods of the presently disclosed embodiments. When a growth front encounters an existing structure, the growth front either changes growth direction to form 90° kinks (FIG. 8A) or melts into the existing one to form a single crystalline joint, FIGS. 8B and 8C.

The sidewalls of the nanobeams are likely passivated by Cl and H as well, although less stable than those of the {010} planes. When the passivation is destabilized by continuous Ti and Si deposition on the side of a frame, branching occurs. Since TiSi$_2$ preferably grows along <100> and <001>, angles between connecting branches are always 90°, yielding the unique 2D network nanostructure disclosed herein. When two growing frames meet, one of the frames either changes growth direction to form a 90° kink or melts into the second frame to form a single crystalline connection (FIG. 8). NN sheets composed of wider, but not thicker, nanobeams are obtainable for extended periods of growth (e.g., 1 hr), implying the {100} and {001} sides are indeed susceptible to further growth. Noticeably, multiple kinks can be formed as seen in FIG. 8A. Scale bars 100 nm, 5 nm and 5 nm, from left to right. Arrows in FIG. 8B and FIG. 8C indicate the growth direction.

Figure 5:
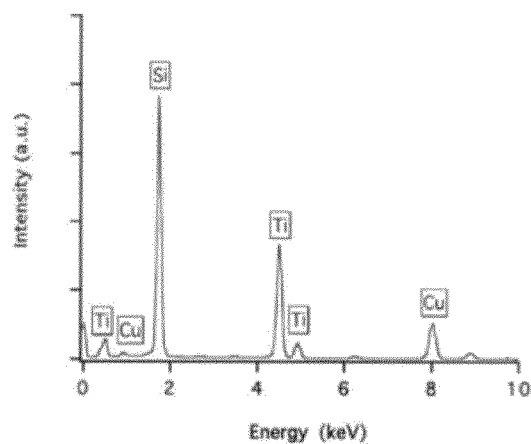
FIG. 5 is an energy dispersive X-ray spectroscopy (EDXRF) spectrum of a complex 2D conductive $TiSi_2$ nanostructure fabricated according to the presently disclosed embodiments. A ratio of the concentration of Ti:Si is about 1:2.
Figure 7:
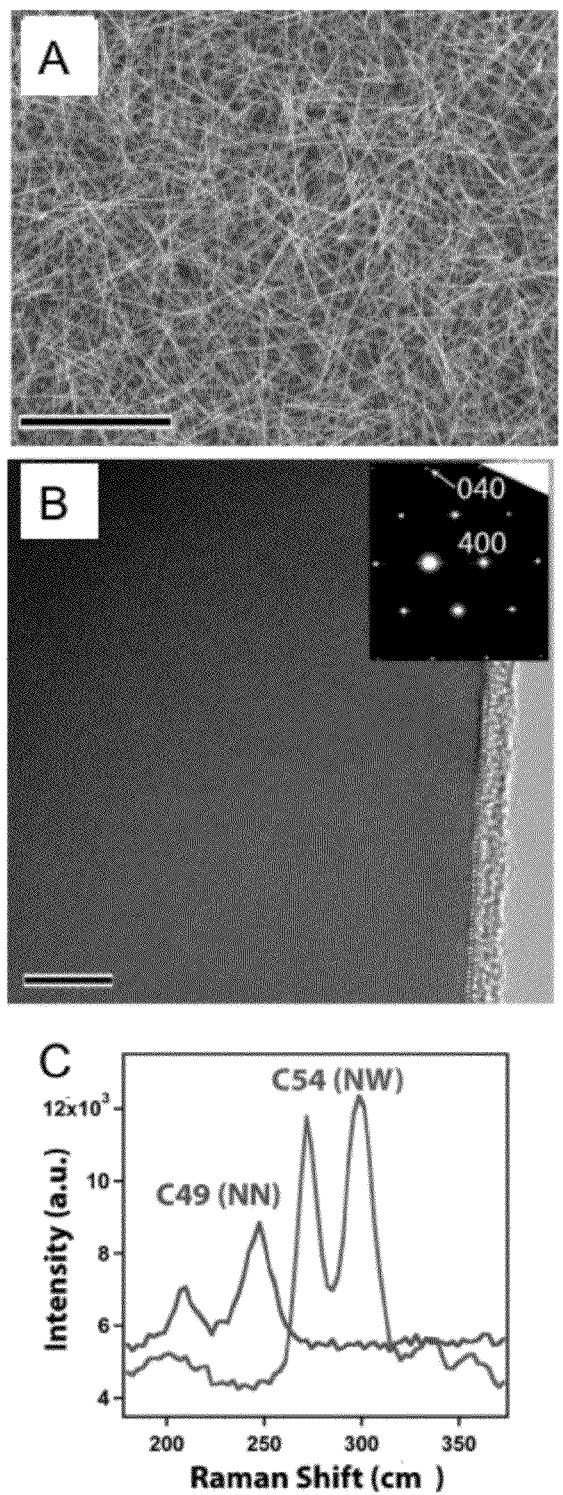
FIG. 7(A-C) show different nanostructures that are obtainable by altering various process parameters of the method of the presently disclosed embodiments as well as Raman spectroscopy analysis of nanowebs versus nanonet sheets.

When growth conditions are changed, for example using different pressures, temperatures and precursor gas ratios, different structures are obtained. For example, as shown in FIG. 7, high quality nanowires (NWs) are also obtainable by using the methods of the presently disclosed embodiments and manipulating the growth parameters. The general trend is that lower pressure, lower SiH$_4$:TiCl$_4$ ratios, and higher temperature favor NWs growth, while the opposite produces more NN sheets. Careful studies of the microstructures, however, revealed that although belonging to the same symmetry group (orthorhombic), NWs obtained by the methods of the presently disclosed embodiments are C54 structure (a=8.236 Å, b=4.773 Å and c=8.523 Å) and grow along b direction. The structural difference can be confirmed by Raman spectrum (see FIG. 7C), as well as TEM characterizations (FIG. 7B). Relatively higher Si concentrations (afforded by higher SiH$_4$ ratios, higher pressures, and lower temperatures) help passivate {010} planes of the C49 structure and therefore lead to NN sheet growth. The degree of supersaturation of TiSi$_2$ in the gas phase can also play a role. The microstructures are evidenced by the high resolution imaging, ED patterns, as well as micro-Raman measurements, see FIG. 7C. Raman spectra were taken on a home-built Raman spectrometer at a laser excitation wavelength of 647 nm, with a power level of 1 mW and 100× object lens. Scale bars: 5 μm in FIG. 7A and 5 nm in FIG. 7B. TiSi$_2$ nanowires are favored for growth conditions with relatively lower Si concentration, e.g. lower pressure and higher temperature.

For bulk TiSi$_2$, C49 phase is reported to form first during solid-state reactions and then is converted to C54 at high temperatures (e.g. 700° C.). C49 TiSi$_2$ has been regarded as the metastable phase that has higher resistivity, due to stacking faults along the b direction. It has been shown that the 2D TiSi$_2$ nanostructures of the presently disclosed embodiments are extremely stable the nanostructure is preserved after up to about 90° C. annealing in H$_2$ for over 30 minutes. The 2D TiSi$_2$ nanostructures of the presently disclosed embodiments are also highly conductive. The remarkable stability may result from the small dimensions; 15 nm film thickness means approximately 10-12 unit cells along <010> direction, within which stacking faults are unlikely events.

The complex 2D conductive silicide nanostructures of the presently disclosed embodiments link low dimensional nanomaterials by high quality single crystalline junctions, providing better charge transport between individual components and stronger mechanical support. Thus, the complex 2D conductive silicide nanostructures of the presently disclosed embodiments are of significant interest for nanoelectronics and emerging solar energy harvesting.

Electrical Properties of 2D $TiSi_2$ NN Sheets.

Figure 9:
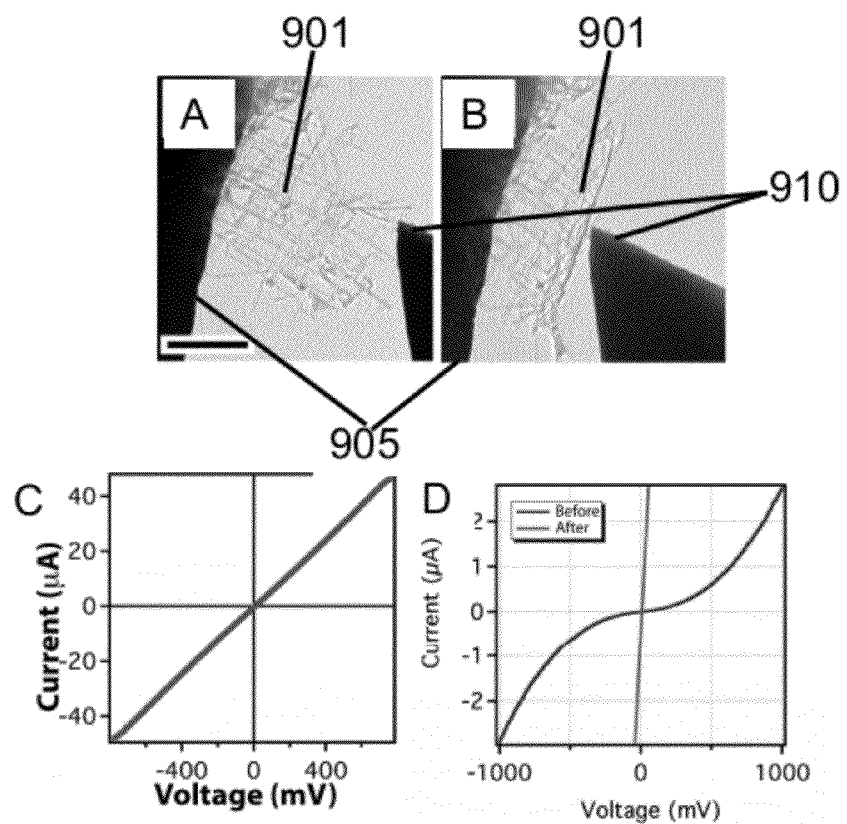
FIG. 9(A-D) show electrical properties of complex 2D conductive $TiSi_2$ nanostructures fabricated according to the methods of the presently disclosed embodiments.

FIG. 9 shows electrical measurements of a $TiSi_2$ NN sheet of the presently disclosed embodiments. The electrical transport measurements on the TiSi2 NN sheet were conducted using a commercial STM-TEM holder (Nanofactory® Instruments AB, ST1000). The NN sheet was adhered to a sharp and fresh gold needle by gently dragging the needle on the surface of the as prepared sample. Another sharp gold probe was piezo-driven to approach the nanonets protruding the gold needle inside the TEM (JOEL 2010F). Electron beams were blocked during the measurements to avoid interferences. Care was also taken to minimize air exposure time during sample preparation, thus to limit surface oxide growth. When pushed by the STM tip, the NN sheet rolled up, see FIG. 9B. The structural change is reversible, demonstrating a remarkable flexibility (the structure survives repeatable bending of curves with radii as small as less than 500 nm). Scale bar: 500 nm. Current-voltage (I-V) curves were obtained by applying biases in the two-terminal configuration, see FIG. 9C. All measurements were conducted under vacuum conditions ($<10^{-5}$ Pa). The gold probes and needles were obtained by etching gold wires (0.010 and 0.013 inches in diameter, respectively) in a 37 weight percent HCl aqueous solution with initial etching currents of 2.00 and 2.25 mA, with a bias of approximately 1 Volt. FIG. 9D shows how annealing was found necessary to form Ohmic contacts between the STM tip and $TiSi_2$ NN sheet of the presently disclosed embodiments. Constant current (50 μA) at large bias (3V) helps from Ohmic contacts.

Electrical resistivity is the resistance of a material in slowing down the electrical current when the material is subject to a potential difference. Electrical resistivity is calculated as:

$\rho = V \cdot A/(I \times l)$, where:

V is the potential difference across the material,
A is the cross-section area,
I is the electrical current flowing through it, and
l is the length of the material.

Lower resistance leads to lower power consumption and faster responses to electrical signals. Lower resistance also allows for higher current as a result of the lower power consumption (hence reduced Joule heating.) Electronics built on low-resistivity materials run faster under the same power consumption or consumes less power while running at the same speed, compared to those made of conventional materials. In energy-related applications such as solar cells, lower resistivity yields better efficiencies by reducing energy lost in transporting light-induced electricity. As shown in the current-voltage curves, the 2D $TiSi_2$ NN sheets of the presently disclosed embodiments are excellent conductors, with low-resistivity. Assuming the thickness of 15 nm and width of 30 nm for a single beam within the NN, and regarding the charge transport path as shortest distance between contacting electrodes, e.g., about 1 μm, the electrical resistivity of the NN sheets are approximately 10 μΩ·cm, in good agreement with that from bulk C54 and significantly better than bulk C49 $TiSi_2$. Without being bound by any particular theory, the absence of defects in the nanostructures of the presently disclosed embodiments, which have been determined to be detrimental in electrical conductance in bulk C49 $TiSi_2$, may play a role in the nanostructures high current ability.

Methods of fabricating two-dimensional conductive silicides include performing chemical vapor deposition, wherein one or more gas or liquid precursor materials carried by a carrier gas stream react to form a nanostructure having a mesh-like appearance and including a plurality of connected and spaced-apart nanobeams linked together at an about 90-degree angle.

The method of the presently disclosed embodiments can be used to synthesize a new 2D nanonet structure. The products are high quality single crystalline complex structures composed of perpendicular nanobeams. The morphology results from the orthorhombic crystal symmetry, and is sensitive to growth conditions; lower Si concentration in the precursor mixture favors NW growth. The high quality single crystalline NN sheets disclosed herein represent one of the most conductive silicides, and opens new doors to new exciting electronic and energy-related applications.

All patents, patent applications, and published references cited herein are hereby incorporated by reference in their entirety. It will be appreciated that several of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. A conductive silicide comprising a plurality of connected and spaced-apart nanobeams linked together at an about 90-degree angle, the plurality of nanobeams forming a two-dimensional nanostructure having a mesh-like appearance.

2. The silicide of claim 1 wherein the silicide is selected from the group consisting of titanium silicide, nickel silicide, iron silicide, platinum silicide, chromium silicide, cobalt silicide, molybdenum silicide and tantalum silicide.

3. The silicide of claim 1 wherein the silicide is titanium silicide.

4. The silicide of claim 1 wherein the plurality of nanobeams are linked together by single crystalline junctions.

5. The silicide of claim 1 belonging to a crystal system selected from the group consisting of hexagonal, tetragonal and orthorhombic.

6. The silicide of claim 1 having a C49 structure.

7. The silicide of claim 1 wherein the plurality of nanobeams have a width of at least about 25 nm.

8. The silicide of claim 1 wherein the plurality of nanobeams are at least about 1.0 μm long.

9. The silicide of claim 1 wherein an overall width of the nanostructure is at least about 1.0 μm.

10. The silicide of claim 1 wherein an overall thickness of the nanostructure is about 15 nm.

11. The silicide of claim 1 for use in a nanoelectronics device.

12. The silicide of claim 1 for use in an energy-related device.

13. The silicide of claim 1 for use in a planar electronic device.

14. A conductive silicide nanostructure comprising a plurality of two-dimensional nanonet sheets, wherein each of the nanonet sheets include connected and spaced-apart nanobeams linked together at an about 90-degree angle.

15. The conductive silicide nanostructure of claim 14 wherein the plurality of nanonet sheets are stacked approximately horizontally.

16. The conductive silicide nanostructure of claim 14 wherein the plurality of nanonet sheets have an electrical resistivity of approximately 10 $\mu\Omega\cdot$cm.

17. A method of fabricating a two-dimensional conductive silicide comprising performing chemical vapor deposition, wherein one or more gas or liquid precursor materials carried by a carrier gas stream react to form a nanostructure having a mesh-like appearance and including a plurality of connected and spaced-apart nanobeams linked together at an about 90-degree angle.

18. The method of claim 17 wherein the silicide is selected from the group consisting of titanium silicide, nickel silicide, iron silicide, platinum silicide, chromium silicide, cobalt silicide, molybdenum silicide and tantalum silicide.

19. The method of claim 17 wherein the one or more gas or liquid precursor materials is selected from a titanium containing chemical and a silicon containing chemical.

20. The method of claim 17 wherein the carrier gas is selected from the group consisting of H, HCl, HF, $Cl_2$, and $F_2$.

21. The method of claim 17 wherein the plurality of nanobeams are linked together by single crystalline junctions.

22. The method of claim 17 wherein an overall thickness of the nanostructure is about 15 nm.

23. The method of claim 17 having an electrical resistivity of about 10 micro-ohm-centimeters.

* * * * *